(12) United States Patent
Parameswaran et al.

(10) Patent No.: US 10,620,644 B1
(45) Date of Patent: Apr. 14, 2020

(54) SYSTEMS AND METHODS FOR ON-DIE HEAT GENERATION AND TEMPERATURE SENSING

(71) Applicant: Xilinx, Inc., San Jose, CA (US)

(72) Inventors: Suresh P. Parameswaran, Fremont, CA (US); Boon Y. Ang, Sunnyvale, CA (US); Sarayanan Balakrishnan, San Ramon, CA (US)

(73) Assignee: XILINX, INC., San Jose, CA (US)

( * ) Notice: Subject to any disclaimer, the term of this patent is extended or adjusted under 35 U.S.C. 154(b) by 123 days.

(21) Appl. No.: 15/968,013

(22) Filed: May 1, 2018

(51) Int. Cl.
| | |
|---|---|
| *G05D 23/19* | (2006.01) |
| *G01K 13/00* | (2006.01) |
| *G05B 15/02* | (2006.01) |
| *H01L 23/34* | (2006.01) |
| *H01L 27/02* | (2006.01) |

(52) U.S. Cl.
CPC ......... *G05D 23/1917* (2013.01); *G01K 13/00* (2013.01); *G05B 15/02* (2013.01); *H01L 23/34* (2013.01); *H01L 23/345* (2013.01); *H01L 27/0211* (2013.01)

(58) Field of Classification Search
CPC .............. G05D 23/1917; H01L 23/345; H01L 27/0211; H01L 23/34; G05B 15/02; G01K 13/00
See application file for complete search history.

(56) References Cited

U.S. PATENT DOCUMENTS

| | | | | |
|---|---|---|---|---|
| 5,309,090 A | * | 5/1994 | Lipp | G01R 31/2856 219/209 |
| 6,847,010 B1 | * | 1/2005 | Hsieh | H01L 22/34 219/209 |
| 7,079,972 B1 | * | 7/2006 | Wood | G06F 1/206 257/E23.08 |
| 9,148,910 B1 | * | 9/2015 | Mimran | H05B 1/023 |
| 2003/0142724 A1 | * | 7/2003 | Barth | G01K 7/01 374/178 |
| 2004/0047099 A1 | * | 3/2004 | Pippin | G06F 1/206 361/103 |
| 2011/0255353 A1 | * | 10/2011 | Fukushima | G01R 31/2874 365/191 |
| 2014/0334107 A1 | * | 11/2014 | Heresztyn | G01K 7/01 361/720 |

(Continued)

OTHER PUBLICATIONS

S. Parameswaran, S. Balakrishnan and B. Ang, "On-die thermal evaluation system," 2017 IEEE International Conference on Microelectronic Systems Education (MSE), Lake Louise, AB, 2017, pp. 55-58. (Year: 2017).*

(Continued)

*Primary Examiner* — Christopher E. Everett
(74) *Attorney, Agent, or Firm* — David O'Brien; Hong Shi

(57) ABSTRACT

A thermal management system includes an integrated circuit (IC). The IC includes a plurality of digitally addressable sectors. Each sector includes an on-die sensing element. The on-die sensing element includes an on-die temperature sensor configured to measure a sector temperature and provide an analog signal associated with the sector temperature; and an on-die digitizer configured to generate a digital sensed temperature signal based on the analog signal. The IC further includes a first output configured to output a plurality of digital sensed temperature signals from the plurality of sectors.

20 Claims, 8 Drawing Sheets

(56) References Cited

U.S. PATENT DOCUMENTS

| | | | | |
|---|---|---|---|---|
| 2015/0148981 A1* | 5/2015 | Kong | ............... | G05D 23/1917 |
| | | | | 700/299 |
| 2017/0038806 A1* | 2/2017 | Prajapati | ............... | G05B 15/02 |
| 2017/0220445 A1* | 8/2017 | Cunningham | ...... | G06F 11/3409 |
| 2018/0203495 A1* | 7/2018 | Campbell | ............ | H01L 23/367 |

OTHER PUBLICATIONS

Yuen, Wen et al., "Field Programmable Thermal Emulator (FPTE): An All-Silicon Test Structure for Thermal Characterization of Integrated Circuits," Proc. of the 30th Annual Thermal Measurement and Management Symposium (Semi-Therm), Mar. 3, 2014, pp. 66-71, IEEE, Piscataway, New Jersey, USA.

\* cited by examiner

SYSTEMS AND METHODS FOR ON-DIE HEAT GENERATION AND TEMPERATURE SENSING

TECHNICAL FIELD

Examples of the present disclosure generally relate to integrated circuits (ICs) and, in particular, to embodiments related to systems and methods for chip-level thermal management using on-die heat generation and temperature sensing.

BACKGROUND

Thermal management is an important topic for modern day IC. Application of on-die heat generation and temperature sensing are used in thermal management.

On-die power dissipation may cause a rise in the die temperature, resulting in reliability issues, performance degradation, and potential malfunction. A higher density of integration and higher frequencies of operation in the ICs may aggravate such issues.

Accordingly, it would be desirable and useful to provide an improved thermal management system for integrated circuits.

SUMMARY

In some embodiments in accordance with the present disclosure, a thermal management system includes an integrated circuit (IC). The IC includes a plurality of sectors, each sector including an on-die sensing element. The on-die sensing element includes an on-die temperature sensor configured to measure a sector temperature and provide an analog signal associated with the sector temperature and an on-die digitizer configured to generate a digital sensed temperature signal based on the analog signal. The IC further includes a first output configured to output a plurality of digital sensed temperature signals from the plurality of sectors.

In some embodiments, the plurality of sectors are uniformly distributed in the IC.

In some embodiments, the plurality of sectors are arranged in an array.

In some embodiments, each sector includes: an on-die heating element configured to generate heat based on a digital heating element control signal.

In some embodiments, a first on-die heating element of a first sector includes an active heating element, and a second on-die heating element of a second sector includes a passive heating element.

In some embodiments, the thermal management system includes a cooling system evaluator unit configured to: generate an initial pre-determined local temperature pattern using the on-die heating elements; after applying a cooling solution to the IC, determine a temperature profile of the IC based on the digital sensed temperature signals; and evaluate an efficiency of the cooling solution based on the initial pre-determined local temperature pattern and the temperature profile.

In some embodiments, the thermal management system includes a heating element controller configured to provide a plurality of digital heating element control signals for controlling a plurality of on-die heating elements in the plurality of sectors; and a sensing element controller configured to read the plurality of digital sensed temperature signals from a plurality of on-die sensing elements in the plurality of sectors.

In some embodiments, the heating element controller uses a first clock signal; and the sensing element controller uses a second clock signal different from the first clock signal.

In some embodiments, the thermal management system includes a dynamic on-die local temperature regulator unit configured to: receive an optimal local temperature associated with a circuit area of the IC; determine a first plurality of sectors within the circuit area; and control on-die heating elements of the first plurality of sectors based on the optimal local temperature.

In some embodiments, the thermal management system includes a dynamic temperature profile monitor unit configured to: receive, from the first output of the IC, the plurality of digital sensed temperature signals; determine a first die location based on the digital sensed temperature signals and a predetermined temperature threshold; and perform a mitigation action to reduce a die temperature at the first die location.

In some embodiments, a method includes providing an integrated circuit (IC) including a plurality of sectors, wherein each sector includes an on-die sensing element; providing, by an on-die temperature sensor of a first on-die sensing element in a first sector, an analog signal associated with a sector temperature of the first sector; generating, by an on-die digitizer of the first on-die sensing element, a digital sensed temperature signal based on the analog signal; and outputting, using a first output of the IC, the digital sensed temperature signal.

In some embodiments, the method includes controlling a first on-die heating element for heat generation based on a digital heating element control signal, where each sector includes an on-die heating element.

In some embodiments, the method includes receiving, using a first input of the IC, the digital heating element control signal.

In some embodiments, the first on-die heating element is an active heating element.

In some embodiments, the method includes providing, by a heating element controller to the IC, a plurality of digital heating element control signals for controlling on-die heating elements in the plurality of sectors; and reading, by a sensing element controller from the IC, the digital sensed temperature signals from on-die sensing elements in the plurality of sectors.

In some embodiments, the method includes: receiving an optimal local temperature associated with a circuit area of the IC; determining a first plurality of sectors within the circuit area; and controlling on-die heating elements in the first plurality of sectors based on the optimal local temperature.

In some embodiments, the method includes: receiving, through the first output of the IC, the plurality of digital sensed temperature signals; determining a first die location based on the digital sensed temperature signals and a predetermined temperature threshold; and performing a mitigation action to reduce a die temperature at the first die location.

Other aspects and features will be evident from reading the following detailed description and accompanying drawings.

DETAILED DESCRIPTION

Figure 1:
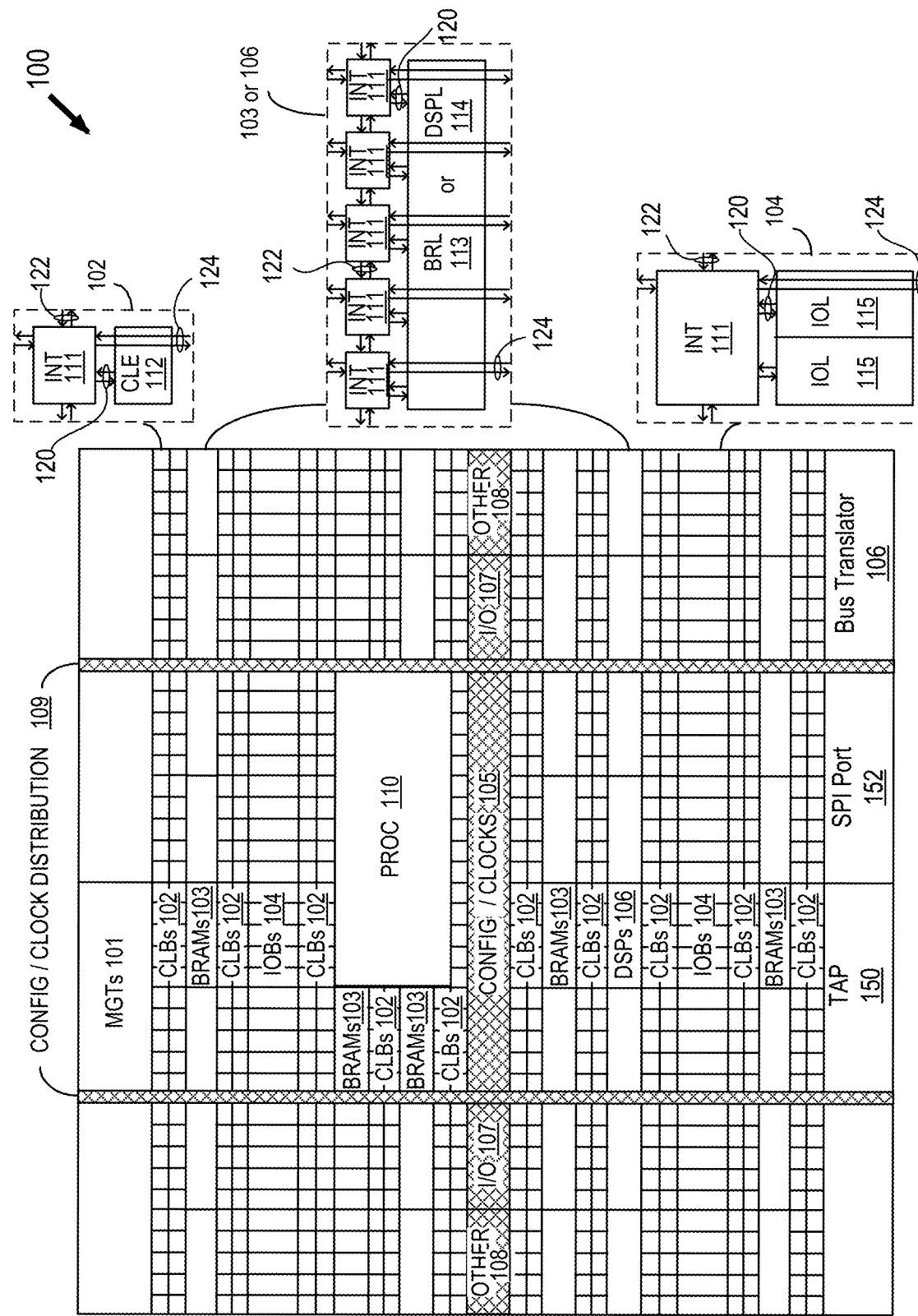
FIG. 1 is a block diagram illustrating an exemplary architecture for an IC according to some embodiments of the present disclosure.

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

Before describing exemplary embodiments illustratively depicted in the several figures, a general introduction is provided to further understanding.

As discussed above, high die temperature can result in reliability issues, performance degradation, and potential malfunction. An IC may have high temperature locations, also referred to as "hot spots," corresponding to die locations that are close to one or more components (e.g., circuits for particular functional units) of the IC that experiences a high workload. On-die temperature sensing elements (e.g., temperature sensing elements formed directly on a die of the IC) may be used to monitor such hot spots. In some examples, on-die temperature sensing elements of an IC generate analog output signals associated with their sensed temperatures respectively. However, in those examples, each on-die temperature sensing element requires an I/O pin of that particular IC for sending out that analog signal. As such, the number of I/O pins of that particular IC may limit the number of sensing elements on a particular IC. Further, reading out such temperature-dependent analog signals from the IC is slow due to slow analog signal readout. This makes such sensing elements not suitable for dynamic temperature profile monitoring.

On the other hand, on-die heating elements (e.g., heating elements formed directly on a die of the IC) may be used to regulate the temperature of a die, where some circuit blocks in the die may perform optimally at a specific temperature. In some examples, on-die heating elements only include passive heating-elements for generating heat. In such examples, heating element programming takes a long time, has low programmability, and does not support concurrent programming along with other thermal management operations including, for example, heating operation, sensing operation, and readout operation. Further, passive heating elements do not represent the majority source of heat in a die. The heat generated by transistors and by resistor-elements are at different locations in the Z-direction within the die and the thermal conductivity of the surrounding materials is different between these two cases—hence heat will be dissipated differently in these two cases. Since transistors are the majority heat-source in a semiconductor chip, by representing the majority heat-source, a realistic heat dissipation behavior is represented.

For integrated circuit (IC) solutions, it has been discovered that by using a sector based architecture for heating elements and/or sensing elements, a flexible and low overhead thermal management system may enable concurrent heat programming, heating, temperature sensing, and readout to determine both the dynamic and static temperature profiles of a die of an IC. For example, in each sector of the IC, localized on-chip digitization may be used to generate digital signal(s) for the analog measurement from the measurement sensor (s) (e.g., temperature sensor) in that sector. Such localized on-chip digitization may reduce the output pin count of the IC for those measurements by multiplexing those digital signals, and provide measurements that are more accurate because of better noise immunity. In those examples, precise external analog measurement is not required because of the use of digital outputs. Such localized on-chip digitization is suitable for arraying of sectors, which allows a larger array of sectors on the IC. The localized on-chip digitization also provides high-speed access to the measurements, and allows dynamic measurement (e.g., temperature) monitoring of the IC. Such localized on-chip digitization may be used for various chip thermal management applications, including, for example, dynamic temperature-profile monitoring, hot-spot mitigation, cooling system evaluation, and dynamic on-die temperature regulation for optimal circuit performance.

With the above general understanding borne in mind, various embodiments for implementing a thermal management system using on-die heat generation and temperature sensing are generally described below. Various advantages may be present in various applications of the present disclosure. No particular advantage is required for all embodiments, and different embodiments may offer different advantages. One of the advantages of some embodiments is that by using an on-die heating system having a sector based architecture with digitally addressable heating elements, fast heat programming with high programmability is achieved. Another advantage of some embodiments is that in the on-die heating system, by using a combination of passive and active heating-elements, the majority heat source in a die is represented. Yet another advantage of some embodiments is that by using a sensing system having a sector based architecture and sensing elements providing a digital sensed temperature signal associated with the sensed temperature, the number of sensing elements is not limited by the number of I/O terminals of a die. Further, such digital signals enable high-speed readout, easy process, and dynamic temperature profile monitoring, and eliminate the need for an operator to make precise analog measurements. Yet another advantage of some embodiments is that by using clock-domains dedicated for heat programming and temperature sensing respectively, concurrent heat programming and sensing is enabled. Yet another advantage of some embodiments is that by using digital input (e.g., for digitally addressable on-die heating elements) and digital output (e.g., for readout of digital sensed temperature signals from on-die sensing elements), the total number of on-die heating elements and on-die sensing elements in a die are not limited by the number of I/O terminals of a die. As such, a large number (e.g., greater than the number of I/O terminals of a die) of on-die heating elements and/or on-die sensing elements may be used for distribution (e.g., uniformly or based on a predetermined distribution plan) in a die. Locally Digitized on-chip Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

In general, each of these programmable logic devices ("PLDs"), the functionality of the device is controlled by configuration data provided to the device for that purpose. The configuration data can be stored in volatile memory (e.g., static memory cells, as common in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an exemplary FPGA architecture 100. The FPGA architecture 100 includes a large number of different programmable tiles, including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An 10B 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the example of FIG. 1, an area (depicted horizontally) near the center of the die (e.g., formed of regions 105, 107, and 108 shown in FIG. 1) can be used for configuration, clock, and other control logic. Column 109 (depicted vertically) extending from this horizontal area or other columns may be used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, PROC 110 spans several columns of CLBs and BRAMs. PROC 110 can include various components ranging from a single microprocessor to a complete programmable processing system of microprocessor(s), memory controllers, peripherals, and the like.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100, and may be replaced with one or more of the other varieties of the programmable blocks described. Further, such blocks can be utilized to form a "soft processor" in that the various blocks of programmable circuitry can be used to form a processor that can execute program code, as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 can be considered programmable circuitry of the IC.

In some embodiments, the functionality and connectivity of programmable circuitry are not established until configuration data is loaded into the IC. A set of configuration data can be used to program programmable circuitry of an IC such as an FPGA. The configuration data is, in some cases, referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

In some embodiments, circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC, more than one adjacent row of CLBs is typically included wherever the CLBs appear, to facilitate the efficient implementation of user logic, but the number of adjacent CLB rows varies with the overall size of the IC. Moreover, the FPGA of FIG. 1 illustrates one example of a programmable IC that can employ examples of the interconnect circuits described herein. The interconnect circuits described herein can be used in other types of programmable ICs, such as CPLDs or any type of programmable IC having a programmable interconnect structure for selectively coupling logic elements.

It is noted that the IC that may implement the thermal management system with on-die heat generation and temperature sensing is not limited to the exemplary IC depicted in FIG. 1, and that IC having other configurations, or other types of IC, may also implement the methods and systems for thermal management with on-die heat generation and temperature sensing.

Figure 2:
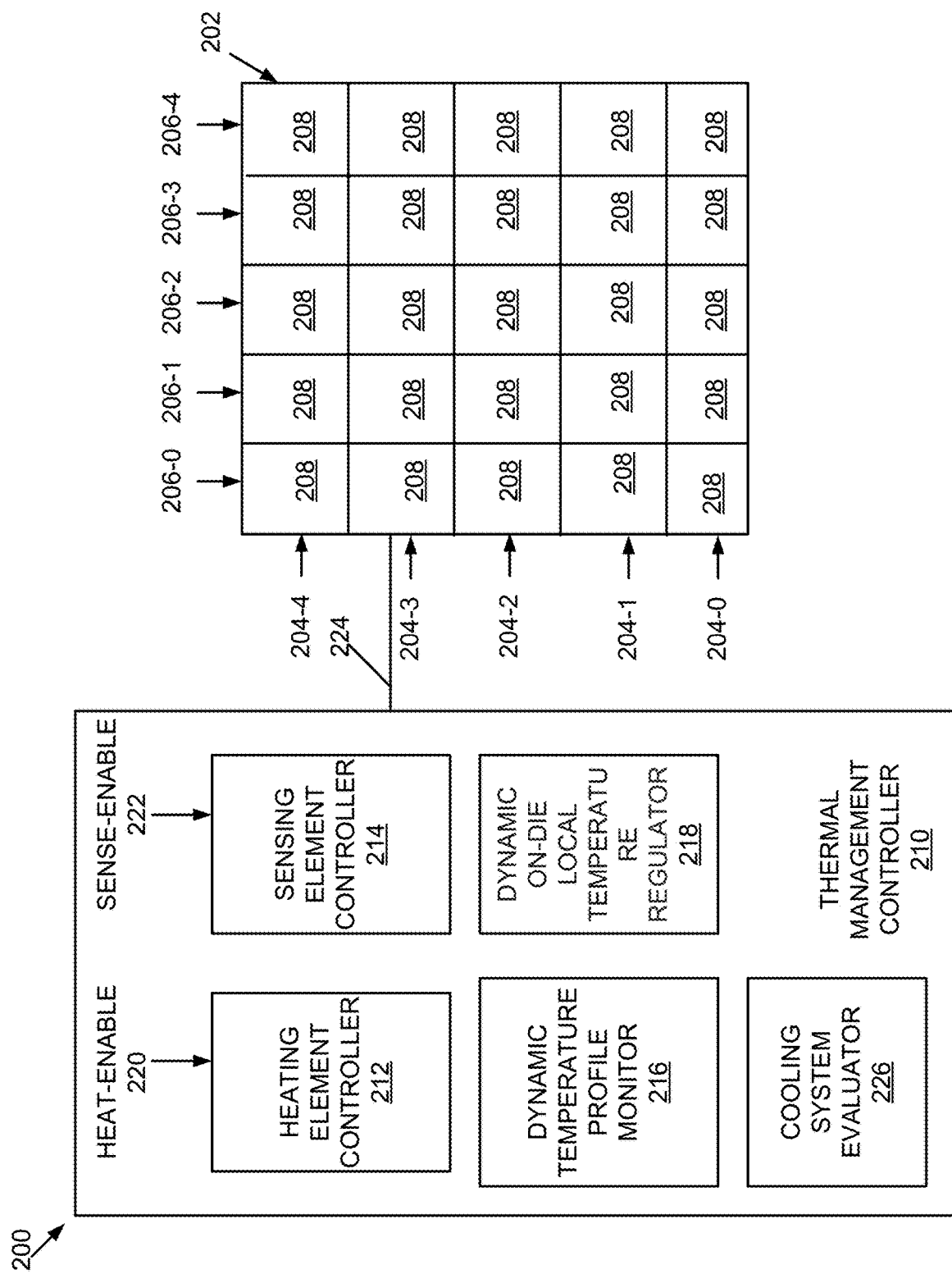
FIG. 2 is a block diagram illustrating an example of a thermal management system according to some embodiments of the present disclosure.

Referring to the example of FIG. 2, illustrated is a thermal management system 200 including a die 202 and a thermal management controller 210. The thermal management controller 210 and the die 202 may communicate through a bus 224. In the example of FIG. 2, the die 202 includes uniformly distributed sectors 208. The sectors 208 in each of the rows 204-0 through 204-4 or each of the columns 206-0 through 206-4 may be collectively referred to as a bank. While five rows and five columns are illustrated in FIG. 2, a die may include sectors distributed in any number of rows and columns, uniformly or nonuniformly. In an example, a die may have 400 sectors uniformly distributed in 20 columns and 20 rows, each sector has an area of a square having a side size of 0.5 mm. In another example, the sector may have a rectangular shape or any suitable shape.

Figure 3:
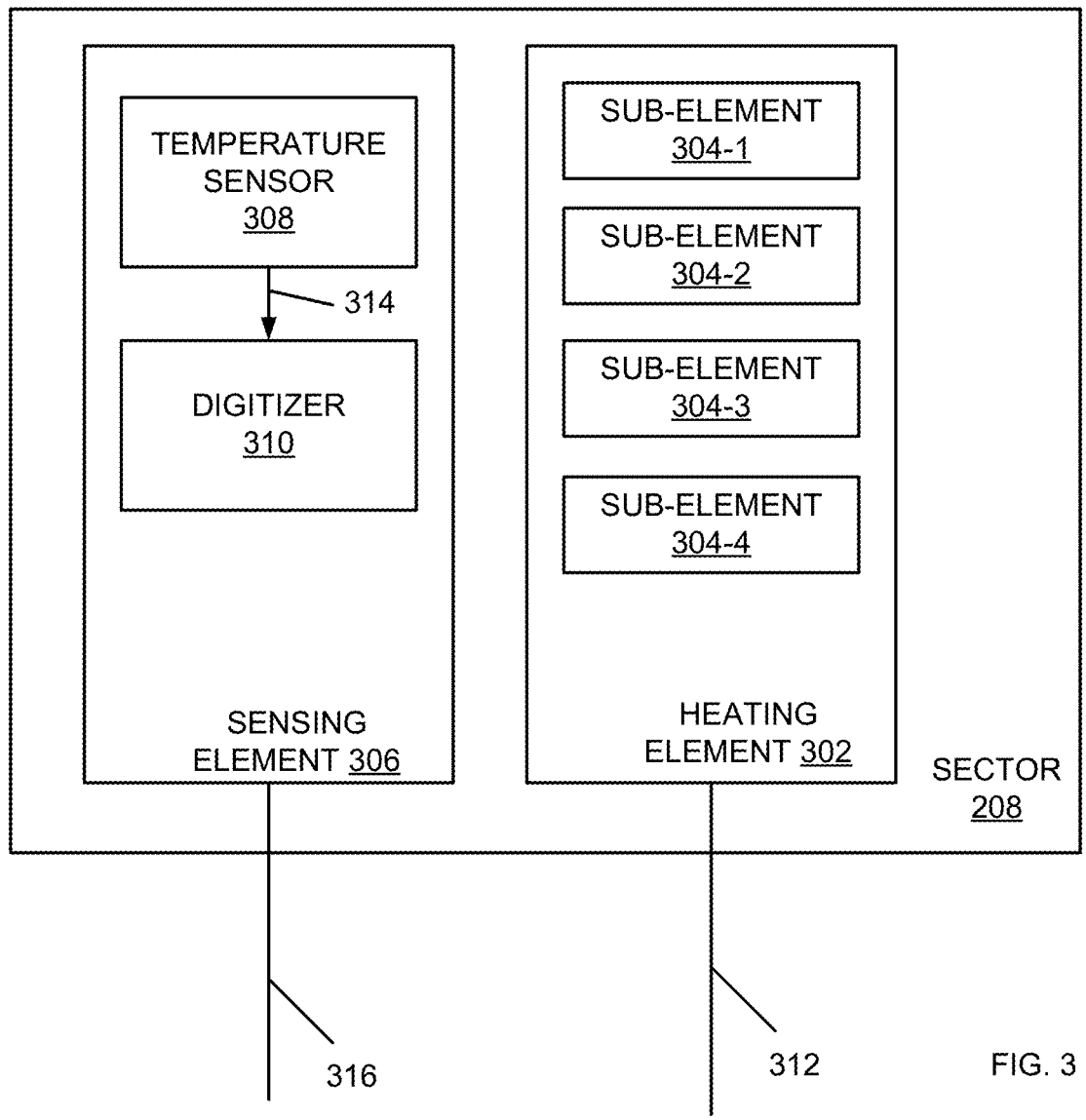
FIG. 3 is a block diagram illustrating an example of a sector of a die according to some embodiments of the present disclosure.

Referring to the example of FIG. 3, a sector 208 of a die 202 may include an on-die heating element 302. The on-die heating element 302 may include a passive heating element that includes a passive device (e.g., a resistor) or an active heating element that includes an active circuit (e.g., a ring-oscillator). In the die 202, the sectors 208 may include a combination of passive heating elements and active heating elements. In other words, some sectors 208 may include on-die passive heating elements, while other sectors 208 may include on-die active heating elements. In the example of FIG. 3, the on-die heating element 302 includes a plurality of sub-elements including sub-elements 304-1, 304-2, 304-3, and 304-4, where each sub-element may be a passive heating element or an active heating element. The number of enabled sub-elements may be controlled (e.g., by a digital heating element control signal 312 from a heating element controller) based on the required power for a target temperature of the sector 208. In an example, where the required power is 0%, 25%, 50%, 75%, and 100% of a maximum power (e.g., between about 1 W/mm$^2$ and 3 W/mm$^2$) generated by the on-die heating element 302, a total number of 0, 1, 2, 3, and 4 of the sub-elements 304-1, 304-2, 304-3, and 304-4 are enabled respectively.

As illustrated in the example of FIG. 3, a sector 208 may include an on-die sensing element 306. The sensing element 306 includes a temperature sensor 308 fabricated directly on the die 202, which may sense a temperature of the sector 208, and generate an analog signal 314 associated with the sensed temperature. In various embodiments, the temperature sensor 308 has a temperature detection range and temperature detection accuracy based on usage requirements. In an example, the temperature sensor 308 has a temperature detection range between about 50° C. to about 125° C., and has a temperature detection accuracy of ±2° C.

A digitizer circuit 310 may receive the analog signal 314, convert the analog signal 314 to a digital signal 316, and output the digital sensed temperature signal 316 (e.g., to a thermal management controller 210 of FIG. 2 through a bus). Unlike sending an analog signal out of a die which requires an I/O terminal of the die, the digital sensed temperature signal 316 may be sent out of the die without a dedicated I/O pin (e.g., by muxing with digital signals from other sectors and using a common bus). As such, by using digital sensed temeratpure signals, the number of sensing elements 306 on a die 202 is not limited by the I/O terminal numbers of that die 202. In an example, a read-out speed of the digital sensed temeratpure signal 316 from the die is about 10 to 50 readings each second for each sector.

Referring to FIG. 2, a thermal management system 200 includes a thermal management controller 210 for performing various thermal management processes by programming the on-die heating elements and reading from the on-die sensing elements of the sectors 208 of the die 202.

In some embodiments, the thermal management controller 210 includes a heating element controller 212, which may receive addresses of particular on-die heating elements (e.g., addresses of corresponding sectors), and control (e.g., enable, disable) the corresponding on-die heating elements at those addresses. In an example, the heating element controller 212 may perform a bank-level control, where any combination of sectors may be enabled for heat generation using the corresponding on-die heating elements, and any number of sub-elements in each sector may be enabled. In another example, the heating element controller 212 may perform a die-level control, where heating in different banks of the die may be concurrently and independently programmed.

The thermal management controller 210 includes a sensing element controller 214, which may read out the digital sensed temperature signals from on-die sensing elements in the sectors 208, together with the corresponding location of the sectors. In various embodiments, the sensing element controller 214 reads out digital sensed temperature signals from sectors based on addressing in a binary sequence order or in a random order provided by the user.

In various embodiments, the heating element controller 212 and the sensing element controller 214 may use independent clock domain signals respectively, such that the programming of the on-die heating elements and the read-out/sensing of the on-die sensing elements may be performed concurrently and independently. As illustrated in FIG. 2, the heating element controller 212 and the sensing element controller 214 may be enabled/disabled indpendently by heat-enable signal 220 and sense-enable signal 222 respectively.

In the example of FIG. 2, the thermal management system 200 may perform various thermal management processes using the heating element controller 212 and sensing element controller. For example, a dynamic temperature profile monitor 216 of the thermal management system 200 may monitor the dynamic temperature profile of a die caused by power dissipation of various circuits of the die during various phases of operations. LIII adsfa In response to detecting one or more hot spots on the die, the dynamic temperature profile monitor 216 may perform various mitigation actions including, for example, enabling customized cooling solutions, customizing the IC throughput to resolve thermal hotspots, and performing real-time re-configuration to resolve thermal hotspots for a programmable IC like FPGA.

In the example of FIG. 2, a dynamic on-die local temperature regulator 218 of the thermal management controller 210 may regulate local temperatures of various circuit areas of a die, where circuits in those circuit areas may perform optimally at different on-die local temperatures. Such dynamic on-die local temperature regulation may be achieved by using the on-die heating elements and on-die sensing elements of the sectors 208 of the die 202.

In the example of FIG. 2, a cooling system evaluator 226 of the thermal management controller 210 may evaluate the efficiency of a cooling solution for a die 202 and adjust the cooling solution. The on-die heating-elements are used to generate an initial pre-determined local temperature pattern, which may be measured accurately using the on-die sensing-elements. A second temperature profile of the die after applying a particular cooling solution may also be measured using the on-die sensing-elements. By comparing the temperature profiles of the die before and after applying a particular cooling solution, the cooling system evaluator 226 may evaluate the efficiency of a cooling solution and to fine-tune the same. Such an evaluation may be performed to characterise the thermal behavior of a die prior to the design of a real product, and such thermal behavior characterisation may be considered in the design of the real product.

Figure 4A:
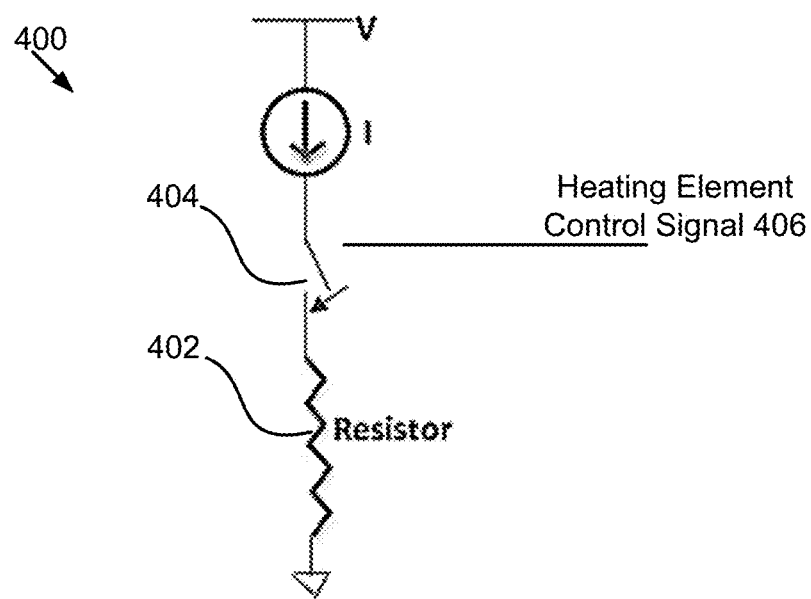
FIG. 4A is a block diagram illustrating an example of a passive heating element according to some embodiments of the present disclosure.
Figure 4B:
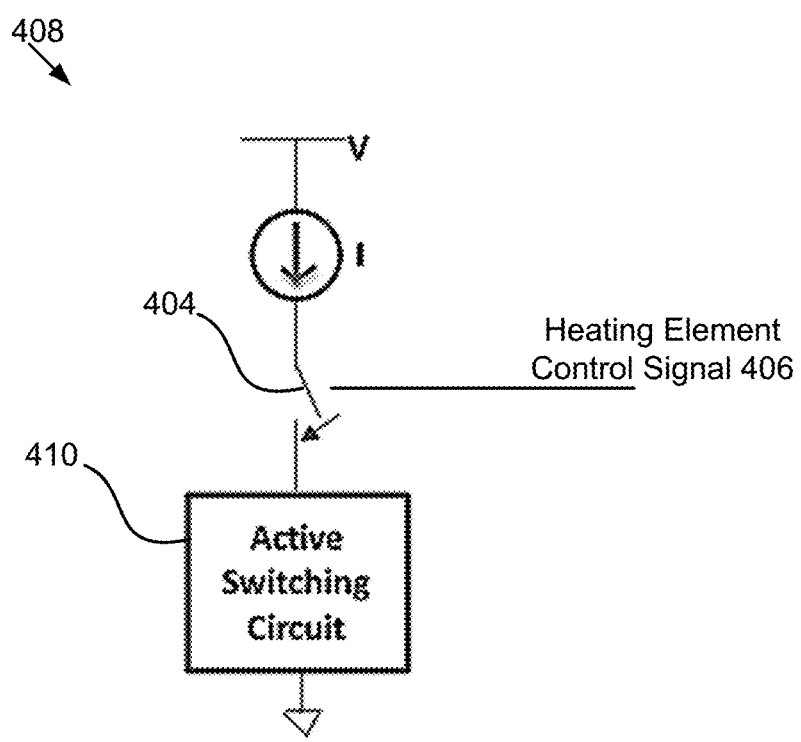
FIG. 4B is a block diagram illustrating an example of an active heating element according to some embodiments of the present disclosure.

Referring to FIGS. 4A and 4B, examples of passive and active heating elements that may be included in an on-die heating element 302 of FIG. 3 are illustrated. The example of FIG. 4A includes a passive heating element 400, which includes a switch 404 and a resistor 402, which is a passive device. A heating element control signal 406 (e.g., from a heating element controller 212) may be used to control the switch 404 (e.g., by turning the switch on and off) to enable or disable the passive heating element 400 for heat generation. The example of FIG. 4B includes an active heating element 408, which includes a switch 404 and an active switching circuit 410 that includes an active device (e.g., a transistor). A heating element control signal 406 (e.g., from a heating element controller 212) may be used to control the switch 404 (e.g., by turning the switch on and off) to enable or disable the active heating element 408 for heat generation.

Figure 5:
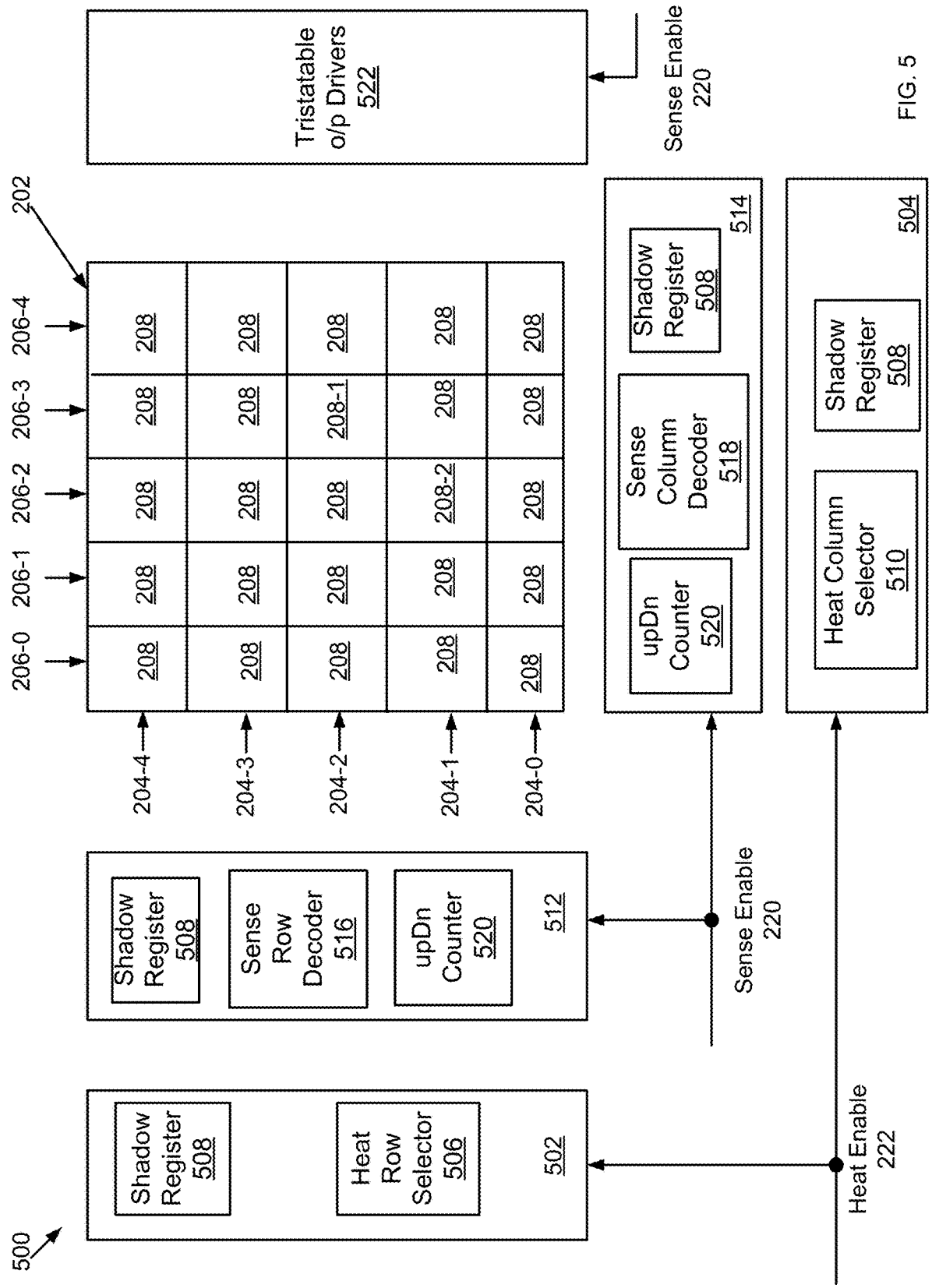
FIG. 5 is a block diagram illustrating an example of a thermal management system according to some embodiments of the present disclosure.

Referring to the example of FIG. 5, illustrated is an example thermal management system 500. The thermal management system 500 is substantially similar to the thermal management system 200 of FIG. 2 except the differences described below. As described in detail below, the on-die heating elements and on-die sensing elements in the sectors may be accessed using digital addresses of the corresponding sectors. By enabling programming on-die heating elements using digital addresses, heating element programmability is improved, and fast heating element programming is achieved. Further, by enabling programming on-die heating elements and reading out from on-die sensing elements using digital addresses, the number (e.g., 400) of on-die heating elements and the number (e.g., 400) of on-die sensing elements of a die may be greater than the number of I/O terminals (e.g., 10) of that die.

In the example of FIG. 5, a heating element controller (e.g., a heating element controller 212 of FIG. 2) uses heating element address handlers 502 and 504 for controlling/programming a particular heating element at a particular address. For example, for programming an on-die heating element at a particular address for the sector 208-1, the heating element address handler 502 uses a heat row selector 506 and a shadow register 508 to select the corresponding row 204-2 of the particular address. Further, the heating element address handler 504 uses a heat column selector 510 and a shadow register 508 to select the corresponding column 206-3 of the particular address. The heating element controller may then program the on-die heating element in the sector 208-1 (e.g., by using a digital heating element control signal) at row 204-2 and column 206-3.

In the example of FIG. 5, a sensing element controller (e.g., a sensing element controller 214) uses sensing element address handlers 512 and 514 for reading out a digital sensed temperature signal from an on-die sensing element at a particular address. In an example, the sensing element controller uses sensing element address handlers 512 and 514 for reading out a digital sensed temperature signal from an on-die sensing element at a particular address for the sector 208-2. In that example, the sensing element address handler 512 uses an up-down counter or shift-register 520, a sense row decoder 516, and a shadow register 508 to determine the row 204-1 corresponding to the particular address for the sector 208-2. The sensing element address handler 514 uses an up-down counter or shift-register 520, a sense column decoder 518, and a shadow register 508 to determine the column 206-2 corresponding to the particular address for the sector 208-2. Shadow-registers are used in this design to load stable decoded address or enable signals for sensing-element and heating-element control. This enables glitch-free operation. Tristatable o/p drivers are used at the bank-level to enable cascading of multiple banks. The drivers of the active bank alone will be enabled and those of inactive banks will be tristated.

Referring to the examples of FIGS. 6A, 6B, 6C, and 6D, by using a large number of on-die heating elements and on-die sensing elements in a die, various power/temperature profiles of a die may be generated (e.g., using on-die heating elements with feedback from on-die sensing elements) and measured (e.g., using on-die sensing elements). FIGS. 6A, 6B, 6C, and 6D show example temperature maps of four banks of a single die respectively. The darkest regions (e.g., regions 602, 612, 616, and 618) indicate the regions of a first temperature. The lightest regions (e.g., regions 606, 608, 614, 620) indicate regions of a second temperature (e.g., lower than the first temperature). The regions 604 and 610 have a third temperature (e.g., between the first and second temperatures). As shown in FIGS. 6A, 6B, 6C, and 6D, the four banks of a single die may concurrently have four different temperature profiles.

Figure 7:
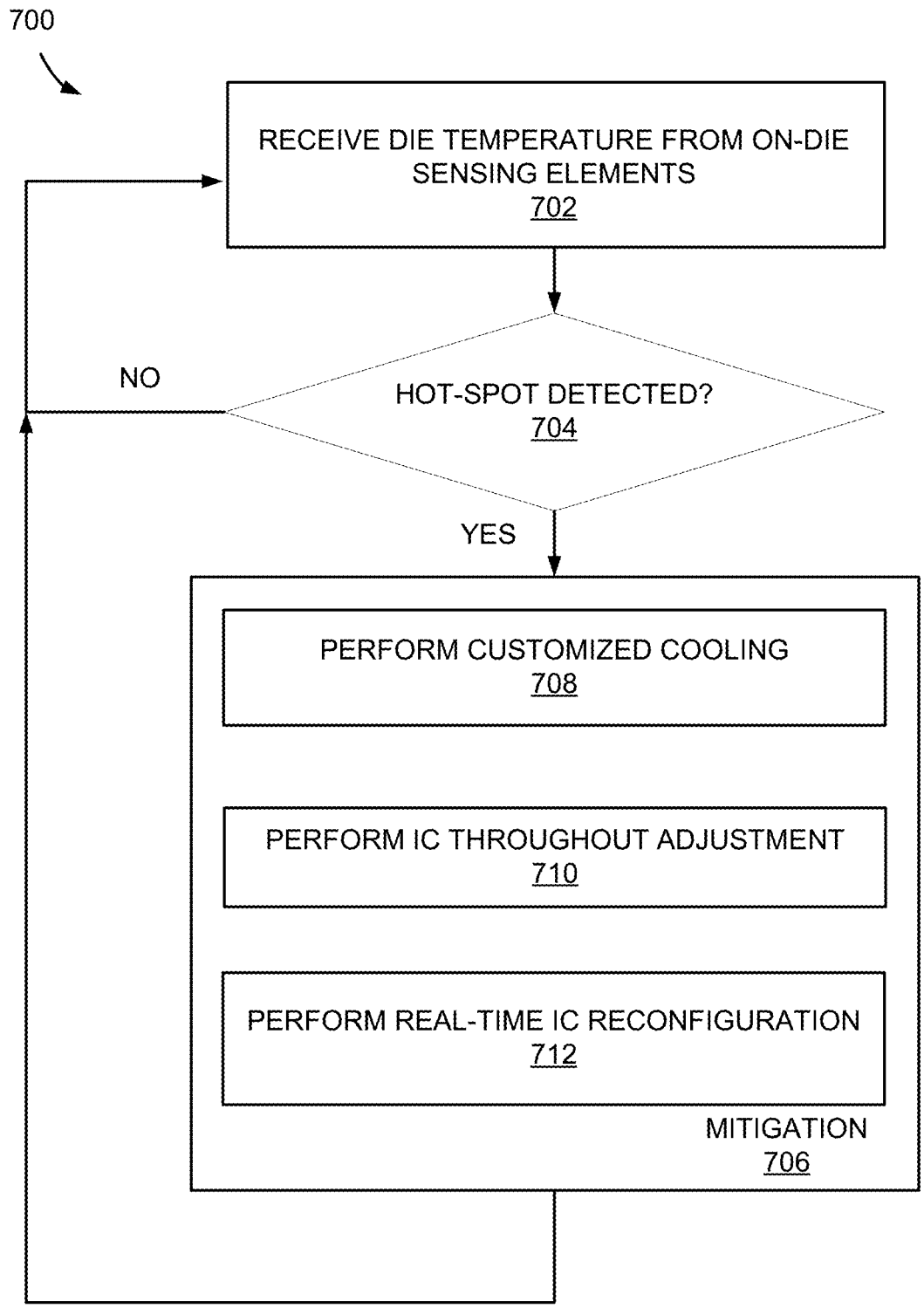
FIG. 7 is a flow diagram illustrating an example of a method for dynamic temperature profile monitoring according to some embodiments of the present disclosure.

Referring to the example of FIG. 7, a method 700 for dynamic temperature profile monitoring is illustrated. The method 700 may begin at block 702, where die temperatures are received from on-die sensing elements. For example, a dynamic temperature profile monitor 216 of FIG. 2 may use sensing element controller 214 to receive die temperatures from sectors 208 of the die 202.

The method 700 may then proceed to block 704 to determine whether one or more hot spot is detected. In an example, at block 704, the dynamic temperature profile monitor 216 detects no hot spot after comparing the received die temperatures with a predetermined threshold (e.g., provided in a digital signal), and proceeds to block 702 to continue monitoring the die temperatures.

In another example, at block 704, the dynamic temperature profile monitor 216 determines that a die temperature in a particular sector has resulted in a hot spot after determining that the received die temperature of that particular sector exceeds a predetermined threshold, and proceeds to block 706. At block 706, various mitigation actions may be performed, including performing customized cooling solutions at block 708, customizing the IC throughput to resolve thermal hotspots at block 710, and performing real-time re-configuration to resolve thermal hotspots for a programmable IC like FPGA at block 712.

Figure 6A:
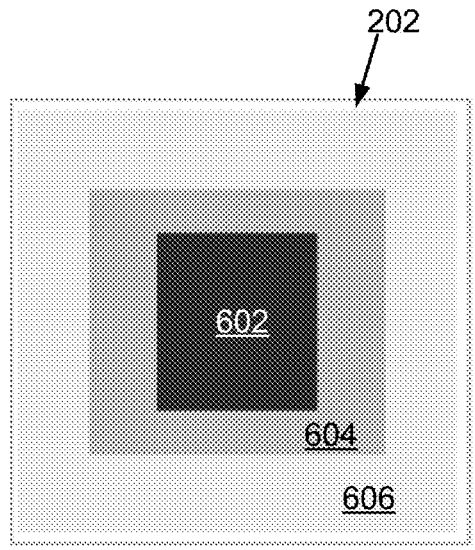
FIGS. 6A, 6B, 6C, and 6D are diagrams illustrating various temperature profiles of a die according to some embodiments of the present disclosure.
Figure 6B:
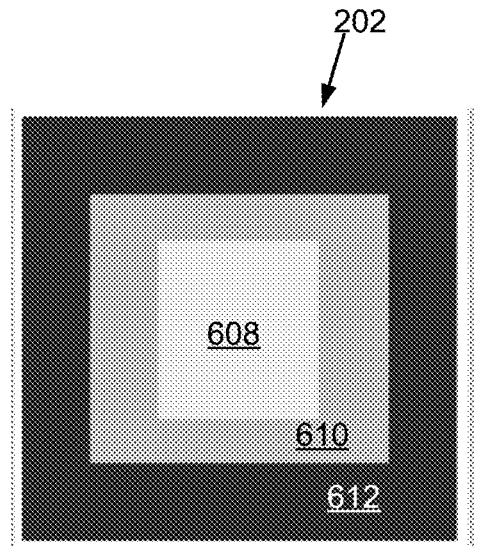
Figure 6C:
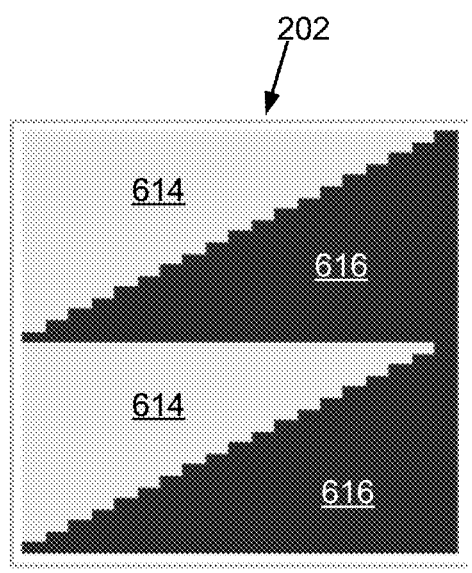
Figure 6D:
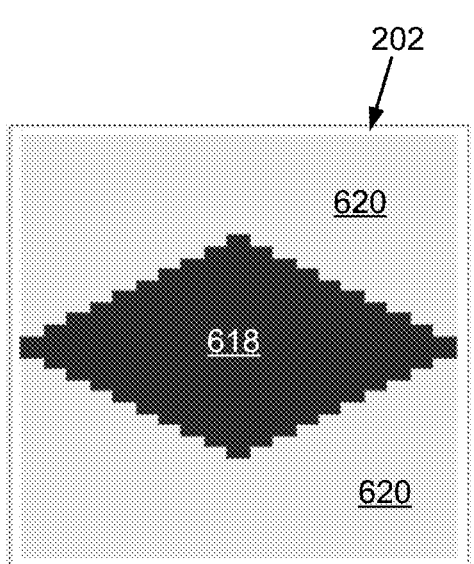
Figure 8:
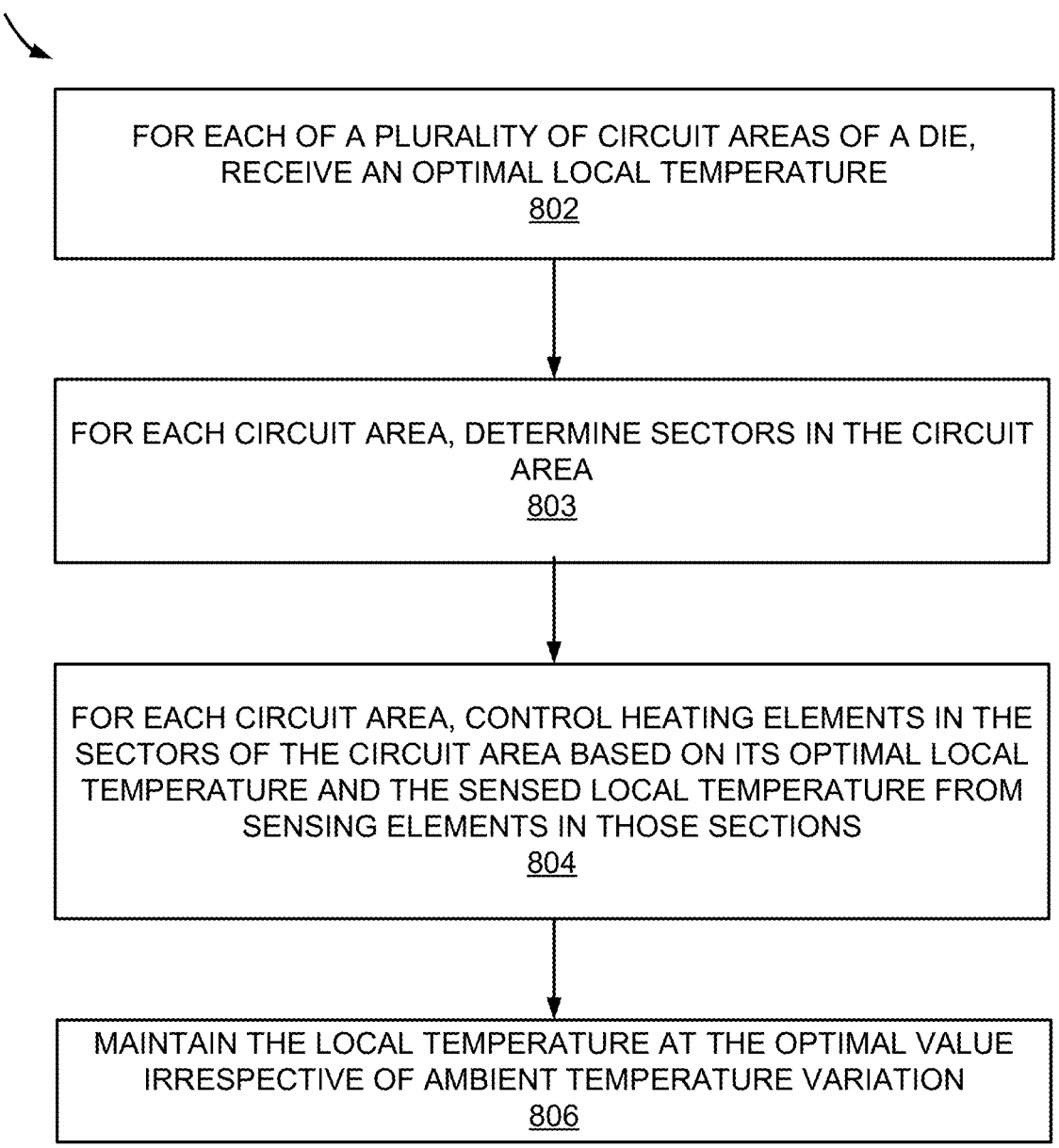
FIG. 8 is a flow diagram illustrating an example of a method for dynamic local temperature regulation for optimized circuit performance according to some embodiments of the present disclosure.

Referring to FIG. 8, a method 800 for dynamic local temperature regulation for optimized circuit performance is illustrated. The method 800 begins at block 802, where an optimal temperature for each of a plurality of circuit areas of a die is received (e.g., as a user input). At block 802, a dynamic on-die local temperature regulator (e.g., a dynamic on-die local temperature regulator 218 of FIG. 2) may receive different optimal local temperatures for different circuit areas of a die 202. In the example of FIG. 6A, different optimal local temperatures T1, T2, T3 may be received for circuit areas 602, 604, and 606.

The method 800 may proceed to block 803, where sectors in each circuit area are determined. In the example of FIG. 6A, different sets of sectors with the sector addresses thereof included in circuit areas 602, 604, and 606 are determined respectively.

The method 800 may proceed to block 804, where on-die heating elements in the corresponding sectors of each circuit area may be controlled based on that circuit area's optimal temperature. For example, at block 804, for each circuit area of the circuit areas 602, 604, and 606, the dynamic on-die local temperature regulator may control the on-die heating elements in the corresponding sectors in that circuit area based on that circuit area's optimal temperature. In some embodiments, the on-die heating elements are controlled based on feedback using digital sensed temperature signals from the corresponding on-die sensing elements in those sectors. By controlling the on-die heating elements in the corresponding sectors of each circuit area based on the corresponding optimal temperature and sensed temperatures from the on-die sensing elements, each circuit area may maintain a local temperature that is optimal (e.g., at the optimal temperature).

The method 800 may proceed to block 806, where after reaching the optimal temperature for each of the sectors, the local temperature is maintained at the optimal value irrespective of ambient temperature variation. In some examples, on-die heating elements in sectors in each circuit area may be controlled based on ambient temperature variation to maintain the local temperature at the optimal value.

It is noted that various configurations illustrated in FIGS. 2 through 8 are exemplary only and not intended to be limiting beyond what is specifically recited in the claims that follow. It will be understood by those skilled in the art in possession of this disclosure that other configurations may be used.

One or more elements in the various embodiments may be implemented by software, hardware (e.g., an application specific integrated circuit (ASIC), a logic on a programmable logic IC (e.g., FPGA)), firmware, and/or a combination thereof. The embodiments may be implemented using various hardware resources, such as for example DSP slices, BRAM, and programmable resources of an FPGA; however, in other embodiments, digital signal processors, microprocessors, multi-core processors, memory, and/or other hardware may be used. When implemented in software, the elements of the embodiments of the invention are essentially the code segments to perform the necessary tasks. The program or code segments can be stored in a processor-readable storage medium or device that may have been downloaded by way of a computer data signal embodied in a carrier wave over a transmission medium or a communication link. The processor readable storage device may include any medium that can store information including an optical medium, semiconductor medium, and magnetic medium. Processor readable storage device examples include an electronic circuit; a semiconductor device, a semiconductor memory device, a read-only memory (ROM), a flash memory, an erasable programmable read-only memory (EPROM); a floppy diskette, a CD-ROM, an optical disk, a hard disk, or other storage device, The code segments may be downloaded via computer networks such as the Internet, Intranet, etc.

Although particular embodiments have been shown and described, it will be understood that it is not intended to limit the claimed inventions to the preferred embodiments, and it will be obvious to those skilled in the art that various changes and modifications may be made without departing from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. A thermal management system, comprising:
   an integrated circuit (IC) including:
   a plurality of sectors, each sector including:
   an on-die sensing element including:
   an on-die temperature sensor configured to measure a sector temperature and provide an analog signal associated with the sector temperature; and
   an on-die digitizer configured to generate a digital sensed temperature signal based on the analog signal; and
   a first output configured to output a plurality of digital sensed temperature signals from the plurality of sectors.

2. The thermal management system of claim 1, wherein the plurality of sectors are uniformly distributed in the IC.

3. The thermal management system of claim 1, wherein the plurality of sectors are arranged in an array.

4. The thermal management system of claim 1, wherein each sector includes:
   an on-die heating element configured to generate heat based on a digital heating element control signal.

5. The thermal management system of claim 4, wherein a first on-die heating element of a first sector includes an active heating element, and
   wherein a second on-die heating element of a second sector includes a passive heating element.

6. The thermal management system of claim 4, further comprising:
   a cooling system evaluator unit configured to:
   generate an initial pre-determined local temperature pattern using the on-die heating elements;
   after applying a cooling solution to the IC, determine a temperature profile of the IC based on the digital sensed temperature signals; and
   evaluate an efficiency of the cooling solution based on the initial pre-determined local temperature pattern and the temperature profile.

7. The thermal management system of claim 4, further comprising:
   a heating element controller configured to provide a plurality of digital heating element control signals for controlling a plurality of on-die heating elements in the plurality of sectors; and
   a sensing element controller configured to read the plurality of digital sensed temperature signals from a plurality of on-die sensing elements in the plurality of sectors.

8. The thermal management system of claim 7,
   wherein the heating element controller uses a first clock signal; and
   wherein the sensing element controller uses a second clock signal different from the first clock signal.

9. The thermal management system of claim 4, further comprising:
   a dynamic on-die local temperature regulator unit configured to:
   receive an optimal local temperature associated with a circuit area of the IC;
   determine a first plurality of sectors within the circuit area; and
   control on-die heating elements of the first plurality of sectors based on the optimal local temperature.

10. The thermal management system of claim 1, further comprising:
    a dynamic temperature profile monitor unit configured to:
    receive, from the first output of the IC, the plurality of digital sensed temperature signals;
    determine a first die location based on the digital sensed temperature signals and a predetermined temperature threshold; and
    perform a mitigation action to reduce a die temperature at the first die location.

11. A method, comprising:
    providing an integrated circuit (IC) including a plurality of sectors, wherein each sector includes an on-die sensing element;
    providing, by an on-die temperature sensor of a first on-die sensing element in a first sector, an analog signal associated with a sector temperature of the first sector;
    generating, by an on-die digitizer of the first on-die sensing element, a digital sensed temperature signal based on the analog signal; and
    outputting, using a first output of the IC, the digital sensed temperature signal.

12. The method of claim 11, wherein the plurality of sectors are uniformly distributed in the IC.

13. The method of claim 11, wherein the plurality of sectors are arranged in an array.

14. The method of claim 11, wherein each sector includes an on-die heating element, further comprising:
    controlling a first on-die heating element for heat generation based on a digital heating element control signal.

15. The method of claim 14, further comprising:
    receiving, using a first input of the IC, the digital heating element control signal.

16. The method of claim 14, wherein the first on-die heating element is an active heating element.

17. The method of claim 14, further comprising:
providing, by a heating element controller to the IC, a plurality of digital heating element control signals for controlling on-die heating elements in the plurality of sectors; and
reading, by a sensing element controller from the IC, the digital sensed temperature signals from on-die sensing elements in the plurality of sectors.

18. The method of claim 17,
wherein the heating element controller uses a first clock signal; and
wherein the sensing element controller uses a second clock signal different from the first clock signal.

19. The method of claim 14, further comprising:
receiving an optimal local temperature associated with a circuit area of the IC;
determining a first plurality of sectors within the circuit area; and
controlling on-die heating elements in the first plurality of sectors based on the optimal local temperature.

20. The method of claim 11, further comprising:
receiving, through the first output of the IC, the plurality of digital sensed temperature signals;
determining a first die location based on the digital sensed temperature signals and a predetermined temperature threshold; and
performing a mitigation action to reduce a die temperature at the first die location.

\* \* \* \* \*